(12) United States Patent
Cheng et al.

(10) Patent No.: US 10,848,149 B2
(45) Date of Patent: Nov. 24, 2020

(54) CHANNEL CIRCUIT OF SOURCE DRIVER AND OPERATION METHOD THEREOF

(71) Applicant: Novatek Microelectronics Corp., Hsinchu (TW)

(72) Inventors: Yen-Cheng Cheng, Hsinchu County (TW); Kuang-Feng Sung, Taichung (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/293,613

(22) Filed: Mar. 5, 2019

(65) Prior Publication Data

US 2020/0028508 A1 Jan. 23, 2020

Related U.S. Application Data

(60) Provisional application No. 62/701,833, filed on Jul. 22, 2018.

(51) Int. Cl.
*H03K 17/687* (2006.01)
*G09G 5/00* (2006.01)

(52) U.S. Cl.
CPC ......... *H03K 17/6872* (2013.01); *G09G 5/003* (2013.01); *G09G 2310/027* (2013.01); *G09G 2310/0291* (2013.01); *G09G 2320/0252* (2013.01)

(58) Field of Classification Search
CPC ............... H03K 17/6872; G09G 5/003; G09G 2310/027; G09G 2310/0291; G09G 2310/0252
See application file for complete search history.

(56) References Cited

U.S. PATENT DOCUMENTS

| | | | |
|---|---|---|---|
| 7,106,281 | B2 | 9/2006 | Kim et al. |
| 8,130,218 | B2 | 3/2012 | Chen et al. |
| 9,761,195 | B2 | 9/2017 | Zheng |
| 9,984,646 | B2 | 5/2018 | Zheng |

(Continued)

FOREIGN PATENT DOCUMENTS

| | | |
|---|---|---|
| CN | 100485758 | 5/2009 |
| CN | 101887698 | 2/2016 |

(Continued)

OTHER PUBLICATIONS

"Office Action of Taiwan Counterpart Application," dated Feb. 18, 2020, p. 1-p. 5.

*Primary Examiner* — Wing H Chow
(74) *Attorney, Agent, or Firm* — JCIPRNET

(57) ABSTRACT

A channel circuit of source driver and an operation method thereof are provided. The channel circuit includes a digital-to-analog converter (DAC), a first switch, an output buffer circuit and a pre-charge circuit. The terminals of the first switch are coupled to the first output terminal of the DAC and the first input terminal of the output buffer circuit, respectively. The pre-charge circuit is coupled to the first input terminal of the output buffer circuit. The pre-charge circuit pre-charges the first input terminal of the output buffer circuit when the first switch is turned off during a pre-charge period, and not to pre-charge the first input terminal of the output buffer circuit when the first switch is turned on during a normal operation period.

24 Claims, 12 Drawing Sheets

(56) References Cited

U.S. PATENT DOCUMENTS

| | | | |
|---|---|---|---|
| 2002/0021606 A1* | 2/2002 | Tsuchi | G09G 3/3688 365/203 |
| 2003/0038760 A1 | 2/2003 | Kim et al. | |
| 2013/0271446 A1 | 10/2013 | Zheng | |
| 2016/0086539 A1 | 3/2016 | Mizukoshi | |
| 2017/0358272 A1 | 12/2017 | Zheng | |
| 2019/0080657 A1 | 3/2019 | Lin et al. | |

FOREIGN PATENT DOCUMENTS

| | | |
|---|---|---|
| CN | 103377635 | 10/2017 |
| TW | I619110 | 3/2018 |

\* cited by examiner

CHANNEL CIRCUIT OF SOURCE DRIVER AND OPERATION METHOD THEREOF

CROSS-REFERENCE TO RELATED APPLICATION

This application claims the priority benefit of U.S. provisional application Ser. No. 62/701,833, filed on Jul. 22, 2018. The entirety of each of the above-mentioned patent applications is hereby incorporated by reference herein and made a part of this specification.

BACKGROUND

Field of the Invention

The invention relates to an electronic circuit and more particularly, to a channel circuit of a source driver and an operation method thereof.

Description of Related Art

FIG. 1 is a schematic circuit block diagram illustrating a conventional channel circuit 10 of a source driver. The channel circuit 10 includes a digital-to-analog converter (DAC) 11 and an output buffer circuit 12. An output terminal of the output buffer circuit 12 is coupleable to a data line 21 of a display panel 20. An output terminal of the DAC 11 is directly coupled to an input terminal of the output buffer circuit 12 through a metal wire 13. The DAC 11 may convert digital pixel data D11 into an analog signal and output the analog signal to the output buffer circuit 12 through the metal wire 13. The output buffer circuit 12 may output a driving signal corresponding to the analog signal to the data line 21 of the display panel 20.

After the analog signal output by the DAC 11 is transited, a period of time is required for recovering a signal level of the metal wire 13 to be stable (to change the signal level to a new level). Generally, the metal wire 13 has a parasitic capacitance (a wiring capacitance) C13, and an input terminal of the output buffer circuit 12 has a parasitic capacitance (an input capacitance) C12. The parasitic capacitances C12 and C13 are one of factors for determining a slew rate of the input terminal signal of the output buffer circuit 12. In any way, as an operation frequency of the display panel 20 increases, a line driving cycle of the data line 21 decreases. The operation frequency of the display panel 20 is usually restricted from be increased by the slew rate of the input terminal signal of the output buffer circuit 12.

In any case, pushing power (driving capability) of the DAC 11 is limited. In a trend that the operation frequency of the display panel 20 becomes higher, the pushing power of the DAC 11 usually fails to meet a design requirement of a recovery time.

It should be noted that the contents of the section of "Description of Related Art" is used for facilitating the understanding of the invention. A part of the contents (or all of the contents) disclosed in the section of "Description of Related Art" may not pertain to the conventional technology known to the persons with ordinary skilled in the art. The contents disclosed in the section of "Description of Related Art" do not represent that the contents have been known to the persons with ordinary skilled in the art prior to the filing of this invention application.

SUMMARY

The invention provides a channel circuit of a source driver and an operation method thereof which contributes to increasing an operation frequency of a display panel.

According to an embodiment of the invention, a channel circuit of a source driver is provided. The channel circuit includes a digital-to-analog converter, a first switch, an output buffer circuit and a pre-charge circuit. A first terminal of the first switch is coupled to a first output terminal of the digital-to-analog converter. A first input terminal of the output buffer circuit is coupled to a second terminal of the first switch. An output terminal of the output buffer circuit is configured to drive a data line of a display panel. The pre-charge circuit is coupled to the first input terminal of the output buffer circuit. When the first switch is turned off during a pre-charge period, the pre-charge circuit is configured to pre-charge the first input terminal of the output buffer circuit. When the first switch is turned on during a normal operation period, the pre-charge circuit does not pre-charge the first input terminal of the output buffer circuit.

According to an embodiment of the invention, an operation method of a channel circuit of a source driver is provided. The operation method includes: providing an analog signal to a first input terminal of an output buffer circuit by a first output terminal of a digital-to-analog converter through a first switch during a normal operation period, wherein an output terminal of the output buffer circuit is configured to drive a data line of a display panel; pre-charging the first input terminal of the output buffer circuit by a pre-charge circuit when the first switch is turned off during a pre-charge period; and not pre-charging the first input terminal of the output buffer circuit by the pre-charge circuit when the first switch is turned on during a normal operation period.

Based on the above, the channel circuit of the source driver and the operation method thereof provided by the embodiments of the invention can pre-charge the input terminal of the output buffer circuit by using the pre-charge circuit with sufficient pushing power during the pre-charge period before the normal operation period. During the normal operation period following the pre-charge period, the output terminal of the digital-to-analog converter can provide the analog signal to the input terminal of the output buffer circuit through the switch. Thus, a recovery time of the output of the digital-to-analog converter can be effectively shortened. The shortened recovery time of the output of the digital-to-analog converter can contribute to increasing the operation frequency of the display panel.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
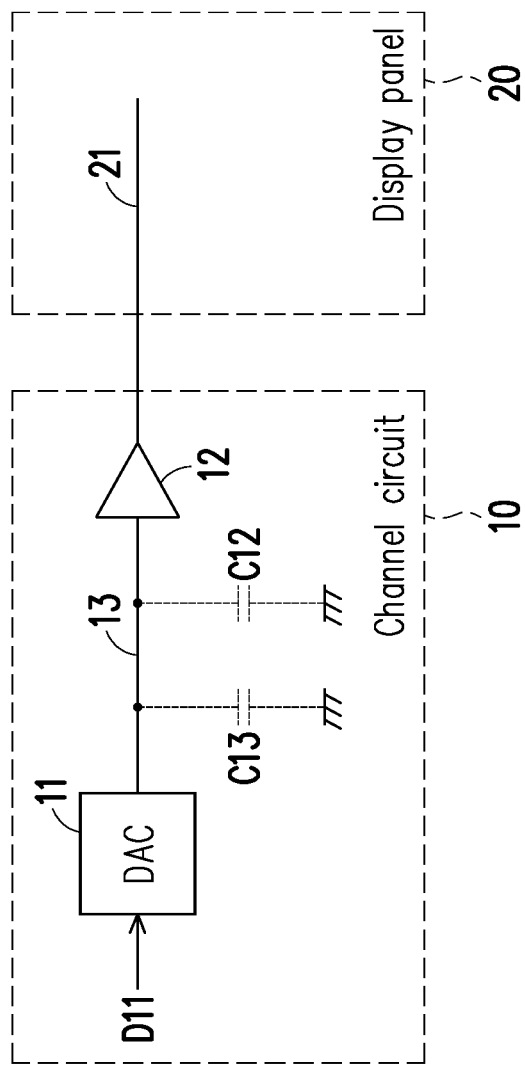
FIG. 1 is a schematic circuit block diagram illustrating a conventional channel circuit of a source driver.

A term "couple" used in the full text of the disclosure (including the claims) refers to any direct and indirect connections. For instance, if a first device is described to be coupled to a second device, it is interpreted as that the first device is directly coupled to the second device, or the first device is indirectly coupled to the second device through other devices or connection means. The terms "first" and "second" mentioned in the full text of the specification (including the claims) are used to name the elements, or for distinguishing different embodiments or scopes, instead of restricting the upper limit or the lower limit of the numbers of the elements, nor limiting the order of the elements. Moreover, wherever possible, components/members/steps using the same referral numerals in the drawings and description refer to the same or like parts.

Components/members/steps using the same referral numerals or using the same terms in different embodiments may cross-refer related descriptions.

Figure 2:
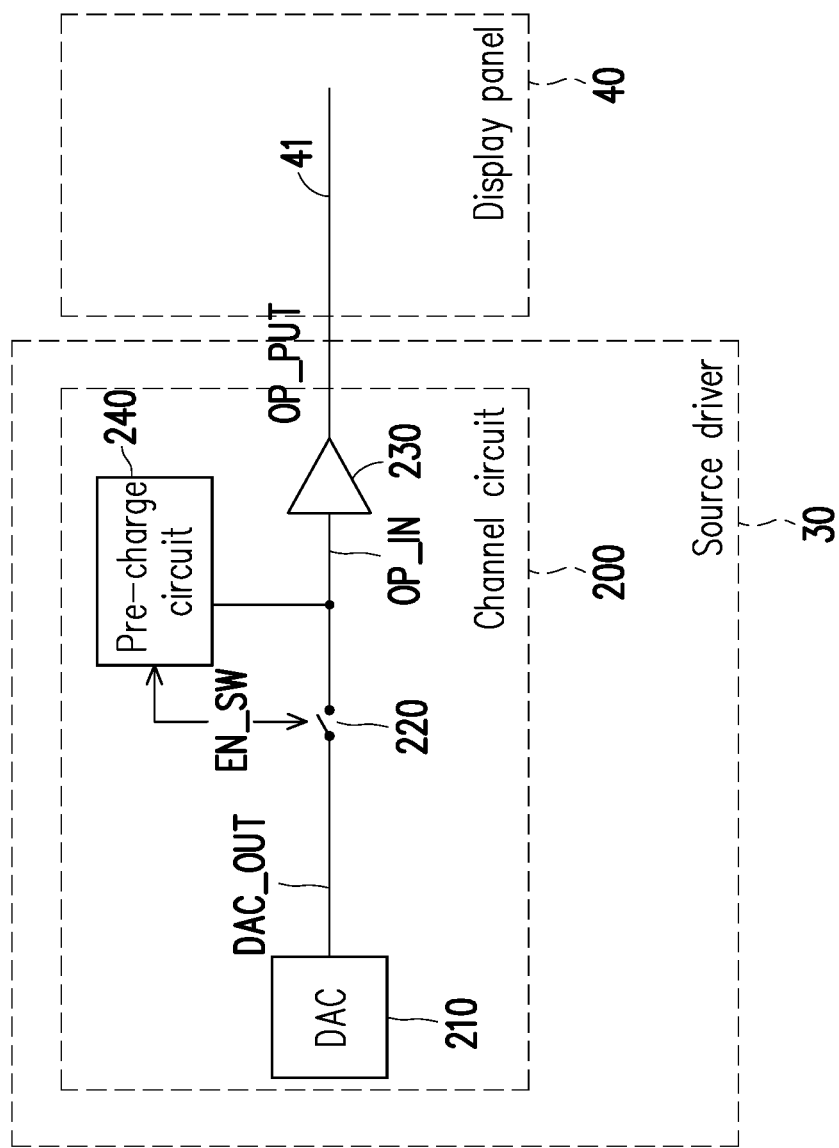
FIG. 2 is a schematic circuit block diagram illustrating a channel circuit of a source driver according to an embodiment of the invention.

FIG. 2 is a schematic circuit block diagram illustrating a channel circuit 200 of a source driver 30 according to an embodiment of the invention. The source driver 30 includes a plurality of channel circuits, for example, the channel circuit 200 illustrated in FIG. 2. The number of the channel circuits in the source driver 30 may be determined based on a design requirement. Any one of the channel circuits can be coupled to at least one corresponding data line among a plurality of data lines of a display panel 40. For example, an output terminal of the channel circuit 200 is coupled to a data line 41 of the display panel 40. Based on a driving operation performed on the data lines by the channel circuits, the display panel 40 is capable of displaying an image. The display panel 40 illustrated in FIG. 2 may be inferred with reference to the display panel 20 illustrated in FIG. 1, and the data line 41 illustrated in FIG. 2 may be inferred with reference to the data line 21 illustrated in FIG. 1, which will not be repeatedly described.

Implementation details of the channel circuit 200 illustrated in FIG. 2 will be described below. The other channel circuits in the source driver 30 may be inferred with reference to the description related to the channel circuit 200 and thus, will not be repeated. In the embodiment illustrated in FIG. 2, the channel circuit 200 includes a digital-to-analog converter (DAC) 210, a switch 220, an output buffer circuit 230 and a pre-charge circuit 240. The implementation manners of the DAC 210 and the output buffer circuit 230 are not limited by the present embodiment. For instance, according to a design requirement, the DAC 210 may be a conventional DAC in the source driver or other digital-to-analog circuits, and the output buffer circuit 230 may be a conventional output buffer circuit in the source driver or other output buffers.

As shown in FIG. 2, the pre-charge circuit 240 can be coupled to an input terminal OP_IN of the output buffer circuit 230. In addition, the pre-charge circuit 240 is configured to pre-charge input terminal OP_IN of the output buffer circuit 230 when the switch 220 is turned off during a pre-charge period and not pre-charge the input terminal OP_IN of the output buffer circuit 230 when the first switch is turned on during a normal operation period later than the pre-charge period. During the normal operation period following the pre-charge period, the output terminal DAC_OUT of the digital-to-analog converter 210 can provide an analog signal to the input terminal of the output buffer circuit through the switch. Accordingly, the input terminal OP_IN of the output buffer circuit 230 can be pre-charged via the pre-charge circuit 240 with sufficient pushing power during the pre-charge period before the normal operation period. Beneficially, a recovery time of the output DAC_OUT of the digital-to-analog converter 210 can be effectively shortened. The shortened recovery time of the output DAC_OUT of the digital-to-analog converter 210 can contribute to increasing the operation frequency of the display panel 40. More detailed will be explained in the following embodiments.

Figure 3:
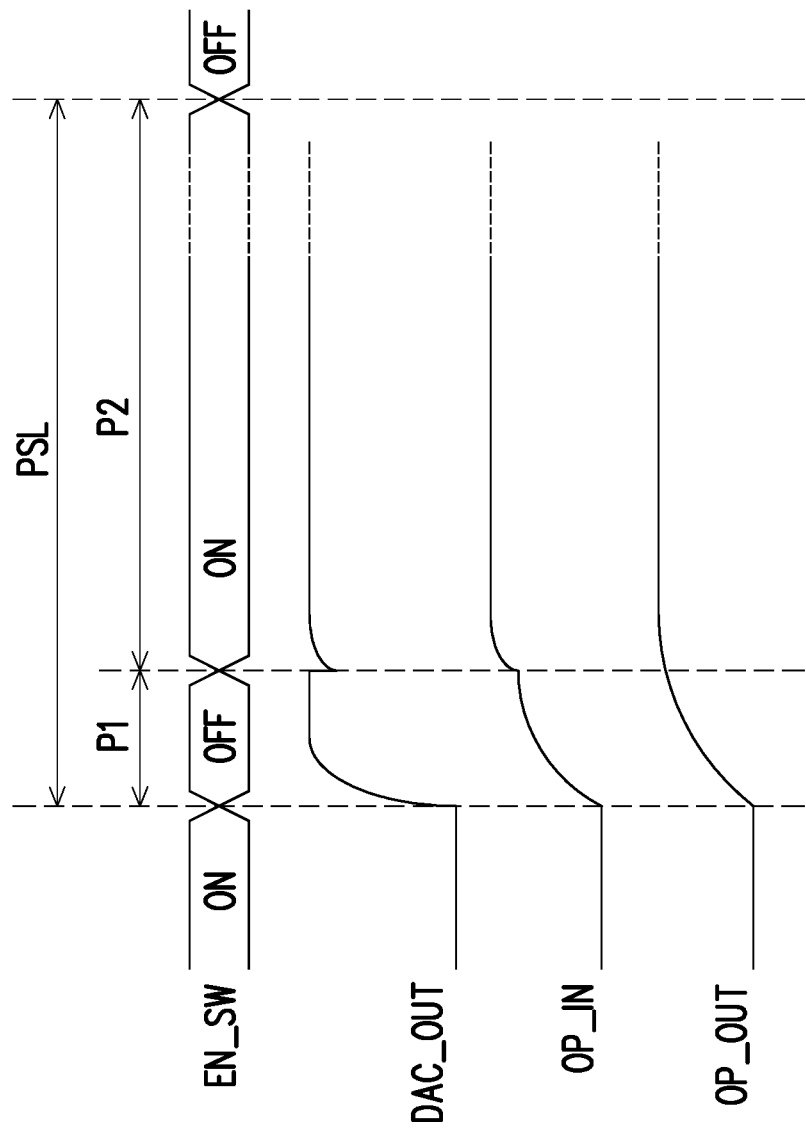
FIG. 3 is a schematic signal waveform diagram of the channel circuit according to an embodiment of the invention.

FIG. 3 is a schematic signal waveform diagram of the channel circuit according to an embodiment of the invention. FIG. 3 is explained together with FIG. 2 below. However, the waveform diagram of FIG. 3 is not limited to being applied to the channel circuit of FIG. 2 but can be applied to other channel circuits. Also, the channel circuit of FIG. 2 is not limited to operate with the signal waveforms shown in FIG. 2 but can operate with signals having different waveforms. In FIG. 3, the horizontal axis represents the time, and the vertical axis represents a signal level (e.g., a voltage level). In the embodiment illustrated in FIG. 3, a scan line period PSL is at least divided into a pre-charge period P1 and a normal operation period P2.

Referring to FIG. 2 and FIG. 3, a first terminal of the switch 220 is coupled to an output terminal of the DAC 210. A second terminal of the switch 220 is coupled to an input terminal of the output buffer circuit 230. An output terminal of the output buffer circuit 230 is configured to drive the data line 41 of the display panel 40. A control terminal of the switch 220 is controlled by control signal EN_SW. The switch 220 is OFF (turned off) during the pre-charge period P1. The switch 220 is ON (turned on) during the normal operation period P2.

Figure 4:
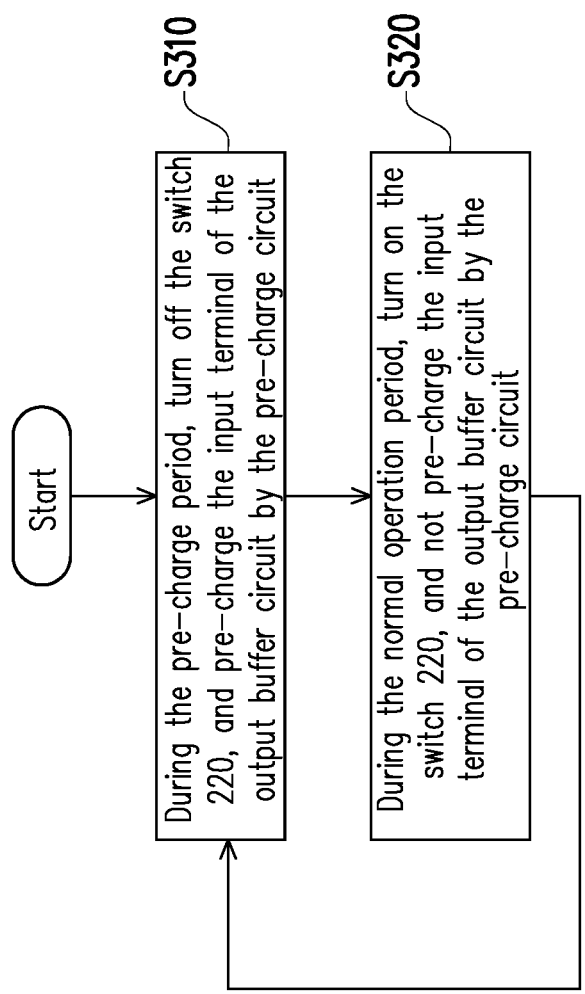
FIG. 4 is a flowchart illustrating an operation method of a channel circuit of a source driver according to an embodiment of the invention.

FIG. 4 is a flowchart illustrating an operation method of a channel circuit of a source driver according to an embodiment of the invention. Referring to FIG. 2 to FIG. 4. In step S310, i.e., during the pre-charge period P1, the switch 220 is OFF, and the pre-charge circuit 240 may pre-charge the input terminal of the output buffer circuit 230. Because the switch 220 is OFF, it causes transition of an analog signal DAC_OUT of the output terminal of the DAC 210 to be accelerated (due to the reduction of the parasitic capacitance) during the pre-charge period P1. When the switch 220 is OFF, the pre-charge circuit 240 may pre-charge an input voltage OP_IN of the input terminal of the output buffer circuit 230 to a preset level, such that an voltage OP_OUT of the output terminal of the output buffer circuit 230 is also pulled up in advance.

In step S320, i.e., during the normal operation period P2, the switch 220 is ON, and the pre-charge circuit 240 does not pre-charge the input terminal of the output buffer circuit 230. For instance, during the normal operation period P2, an output terminal of the pre-charge circuit 240 is in a high-impedance (Hi-z) state. When the switch 220 is ON, the output terminal of the DAC 210 may provide the analog signal to the input terminal of the output buffer circuit 230 through the switch 220.

Based on the above, the input terminal of the output buffer circuit 230 may be pre-charged by the pre-charge circuit 240 with sufficient pushing power during the pre-charge period P1 before the normal operation period P2. During the normal operation period P2 following the pre-charge period P1, the output terminal of the DAC 210 may provide the analog signal to the input terminal of the output buffer circuit 230 through the switch 220. Thus, a recovery time of an output of the DAC 210 may be effectively shortened. The shortened recovery time of the output of the DAC 210 may contribute to increasing an operation frequency of the display panel 40.

Figure 5:
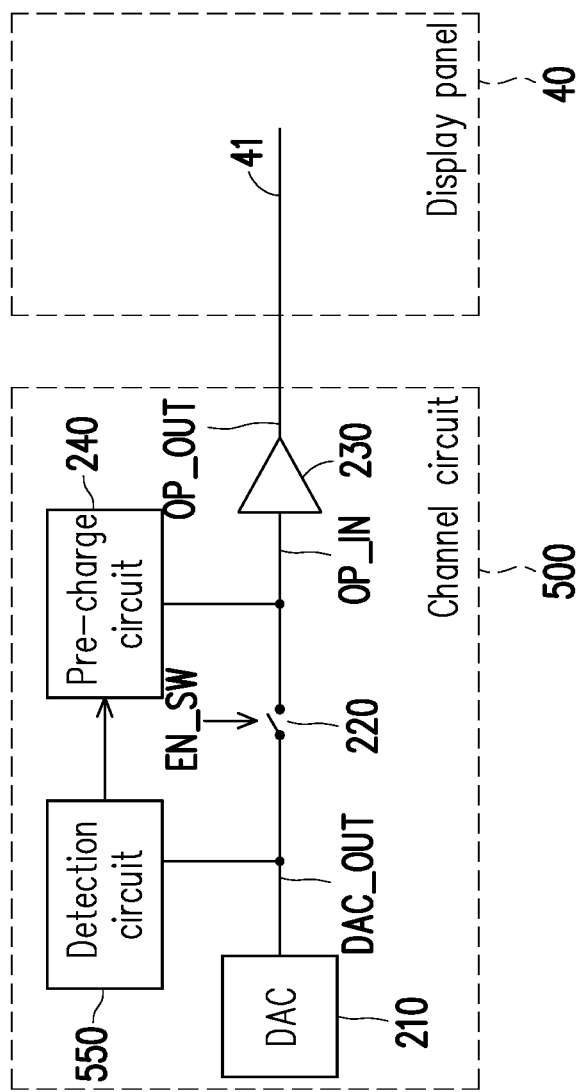
FIG. 5 is a schematic circuit block diagram illustrating a channel circuit of a source driver according to another embodiment of the invention.

FIG. 5 is a schematic circuit block diagram illustrating a channel circuit 500 of a source driver according to another embodiment of the invention. The channel circuit 500 illustrated in FIG. 5 may be inferred with reference to the description related to the channel circuit 200 illustrated in FIG. 2 and thus, will not be repeated. In the embodiment illustrated in FIG. 5, the channel circuit 500 includes a DAC 210, a switch 220, an output buffer circuit 230, a pre-charge circuit 240 and a detection circuit 550. The DAC 210, the switch 220, the output buffer circuit 230 and the pre-charge circuit 240 illustrated in FIG. 5 may be inferred with reference to the descriptions related to the embodiments illustrated in FIG. 2 to FIG. 4 and thus, will not be repeated.

Referring to FIG. 3 and FIG. 5, the detection circuit 550 illustrated in FIG. 5 is coupled to a control terminal of the pre-charge circuit 240. The detection circuit 550 may provide a detection result to the pre-charge circuit 240. The pre-charge circuit 240 may pre-charge the input terminal of the output buffer circuit 230 according to the detection result during the pre-charge period P1. For instance, the detection circuit 550 may be coupled to the output terminal of the DAC 210 to detect the analog signal DAC_OUT of the output terminal of the DAC 210 to obtain the detection result. The detection circuit 550 may be configured to enable the pre-charge circuit 240 when the analog signal meets a predetermined condition. In some embodiments, when the analog signal DAC_OUT of the output terminal of the DAC 210 is transited, the detection circuit 550 may notify the pre-charge circuit 240, such that the pre-charge circuit 240 may pre-charge the input terminal of the output buffer circuit 230 according to the detection result during the pre-charge period P1.

In some embodiments, the pre-charge circuit 240 may be configured to further determine a pre-charge voltage level according to the detection result of the detection circuit 550. The pre-charge circuit 240 may pre-charge the input terminal of the output buffer circuit 230 according to the pre-charge voltage level.

In some embodiments, the detection circuit 550 is further coupled to the input terminal of the output buffer circuit 230 to detect an input (i.e., the input voltage OP_IN) of the output buffer circuit 230. The detection circuit 550 is configured to obtain the detection result according to a difference between a voltage (e.g., the analog signal DAC_OUT) of the output terminal of the DAC 210 and a voltage (e.g., the input voltage OP_IN) of the input terminal of the output buffer circuit 230. In some embodiments, the detection circuit 550 can be configured to detect whether a level difference between a level of the analog signal DAC_OUT of the output terminal of the DAC 210 and a level of the input terminal OP_IN of the output buffer circuit 230 exceeds a predetermined difference. If the level different exceeds the predetermined difference, the detection circuit 550 can enable the pre-charge circuit to pre-charge the input terminal OP_IN of the output buffer circuit 230.

Figure 6:
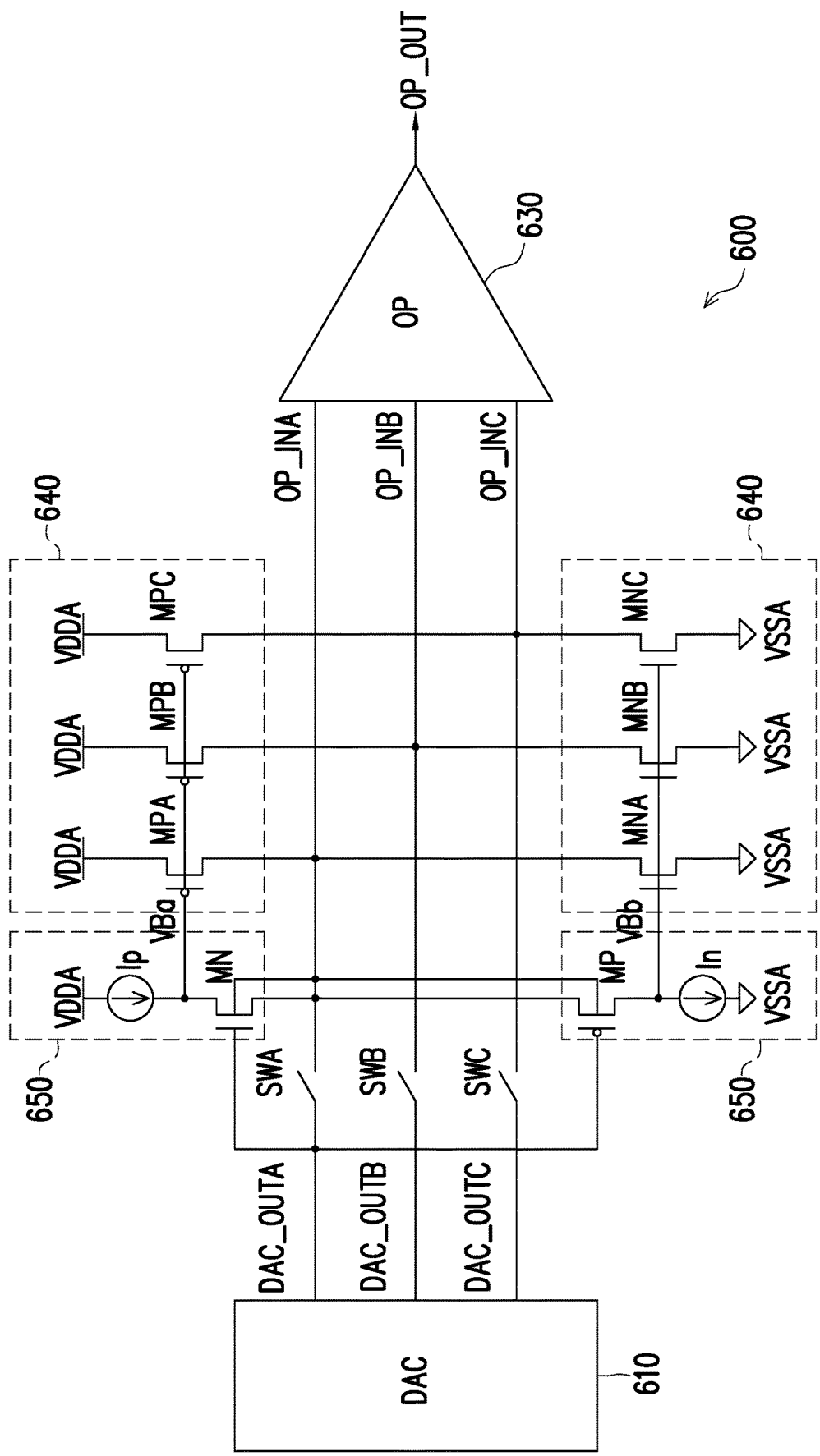
FIG. 6 is a schematic circuit block diagram illustrating a channel circuit of a source driver according to yet another embodiment of the invention.

FIG. 6 is a schematic circuit block diagram illustrating a channel circuit 600 of a source driver according to yet another embodiment of the invention. In the embodiment illustrated in FIG. 6, the channel circuit 600 includes a DAC 610, a switch SWA, a switch SWB, a switch SWC, an output buffer circuit 630, at least one pre-charge circuit 640 and at least one detection circuit 650. The channel circuit 600, the DAC 610, the output buffer circuit 630, the pre-charge circuit 640 and the detection circuit 650 illustrated in FIG. 6 may be inferred with reference to the descriptions related to the channel circuit 500, the DAC 210, the output buffer circuit 230, the pre-charge circuit 240 and the detection circuit 550 illustrated in FIG. 5, and the switch SWA, the switch SWB and the switch SWC illustrated in FIG. 6 may be inferred with reference to the related description related to the switch 220 illustrated in FIG. 5, which will not be repeated.

In the embodiment illustrated in FIG. 6, a first terminal and a second terminal of the switch SWA are respectively coupled to a first output terminal of the DAC 610 and a first input terminal of the output buffer circuit 630, a first terminal and a second terminal of the switch SWB are respectively coupled to a second output terminal of the DAC 610 and a second input terminal of the output buffer circuit 630, and a first terminal and a second terminal of the switch SWC are respectively coupled to a third output terminal of the DAC 610 and a third input terminal of the output buffer circuit 630.

In some embodiments, during a pre-charge period, the pre-charge circuit 640 may pre-charge the first input terminal OP_INA, the second input terminal OP_INB and the third input terminal OP_INC of the output buffer circuit 630. In addition, the pre-charge circuit 640 may pre-charge an input voltage OP_INA of the first input terminal, an input voltage OP_INB of the second input terminal and an input voltage OP_INC of the third input terminal of the output buffer circuit 630 to different preset levels (or the same preset level).

In the pre-charge period, the switch SWA, the switch SWB and the switch SWC are preferably turned OFF. By turning the switch SWA, the switch SWB and the switch SWC to be OFF during the pre-charge period, the transition of an analog signal DAC_OUTA of the first output terminal, an analog signal DAC_OUTB of the second output terminal and an analog signal DAC_OUTC of the third output terminal of the DAC 610 can be accelerated due to the reduction of the parasitic capacitance.

During a normal operation period later than the pre-charge period, the switch SWA, the switch SWB and the switch SWC are ON, and the pre-charge circuit 640 does not pre-charge the first input terminal, the second input terminal and the third input terminal of the output buffer circuit 630. For instance, during the normal operation period P2, the output terminals of the pre-charge circuit 640 are in a Hi-z state. When the switch SWA, the switch SWB and the switch SWC are ON, an output terminal of the DAC 610 may provide the analog signals to the input terminals of the output buffer circuit 630 through the switch SWA, the switch SWB and the switch SWC.

In the embodiment illustrated in FIG. 6, a detection result output by the detection circuit 650 includes a bias voltage VBa and a bias voltage VBb.

In the embodiment illustrated in FIG. 6, the detection circuit 650 illustrated in FIG. 6 includes a transistor MN and a transistor MP. The transistor MN and the transistor MP are configured to control a level of the bias voltage VBa and a level of the bias voltage VBb according to a difference between the analog signal DAC_OUTA and the input voltage OP_INA. A control terminal (e.g., a gate) of the transistor MN is coupled to the first output terminal of the DAC 610 to receive the analog signal DAC_OUTA. A first terminal (e.g., a drain) of the transistor MN is coupled to a current supply terminal of the current source Ip. A voltage of the first terminal of the transistor MN serves as the bias voltage VBa. A second terminal (e.g., a source) of the transistor MN is coupled to the first input terminal of the output buffer circuit 630 to receive the input voltage OP_INA. A control terminal (e.g., a gate) of the transistor MP is coupled to the first output terminal of the DAC 610 to receive the analog signal DAC_OUTA. A first terminal (e.g., a drain) of the transistor MP is coupled to a current drain terminal of the current source In. A voltage of the first terminal of the transistor MP serves as the bias voltage VBb. A second terminal (e.g., a source) of the transistor MP is coupled to the first input terminal of the output buffer circuit 630 to receive the input voltage OP_INA. With such an implementation, the transistor MN and the transistor MP can correspondingly control the level of the bias voltage VBa and the level of the bias voltage VBb according to the difference between the analog signal DAC_OUTA and the input voltage OP_INA.

In the embodiment illustrated in FIG. 6, the pre-charge circuit 640 includes a transistor MPA, a transistor MPB, a transistor MPC, a transistor MNA, a transistor MNB and a transistor MNC. Control terminals (e.g., gates) of the transistor MPA, the transistor MPB and the transistor MPC are coupled to the detection circuit 650 to receive the bias voltage VBa. First terminals (e.g., sources) of the transistor MPA, the transistor MPB and the transistor MPC are coupled to voltages VDDA. Control terminals (e.g., gates) of the transistor MNA, the transistor MNB and the transistor MNC are coupled to the detection circuit 650 to receive the bias voltage VBb. First terminals (e.g., sources) of the transistor MNA, the transistor MNB and the transistor MNC are coupled to voltages VSSA. Second terminals (e.g., drains) of the transistor MPA and the transistor MNA are coupled to the first input terminal of the output buffer circuit 630. Second terminals (e.g., drains) of the transistor MPB and the transistor MNB are coupled to the second input terminal of the output buffer circuit 630. Second terminals (e.g., drains) of the transistor MPC and the transistor MNC are coupled to the third input terminal of the output buffer circuit 630. With such an implementation, the pre-charge circuit 640 may determine a pre-charge voltage level according to the detection result of the detection circuit 650. The pre-charge circuit 640 may pre-charge the plurality of input terminals of the output buffer circuit 630 according to the pre-charge voltage level.

Figure 7:
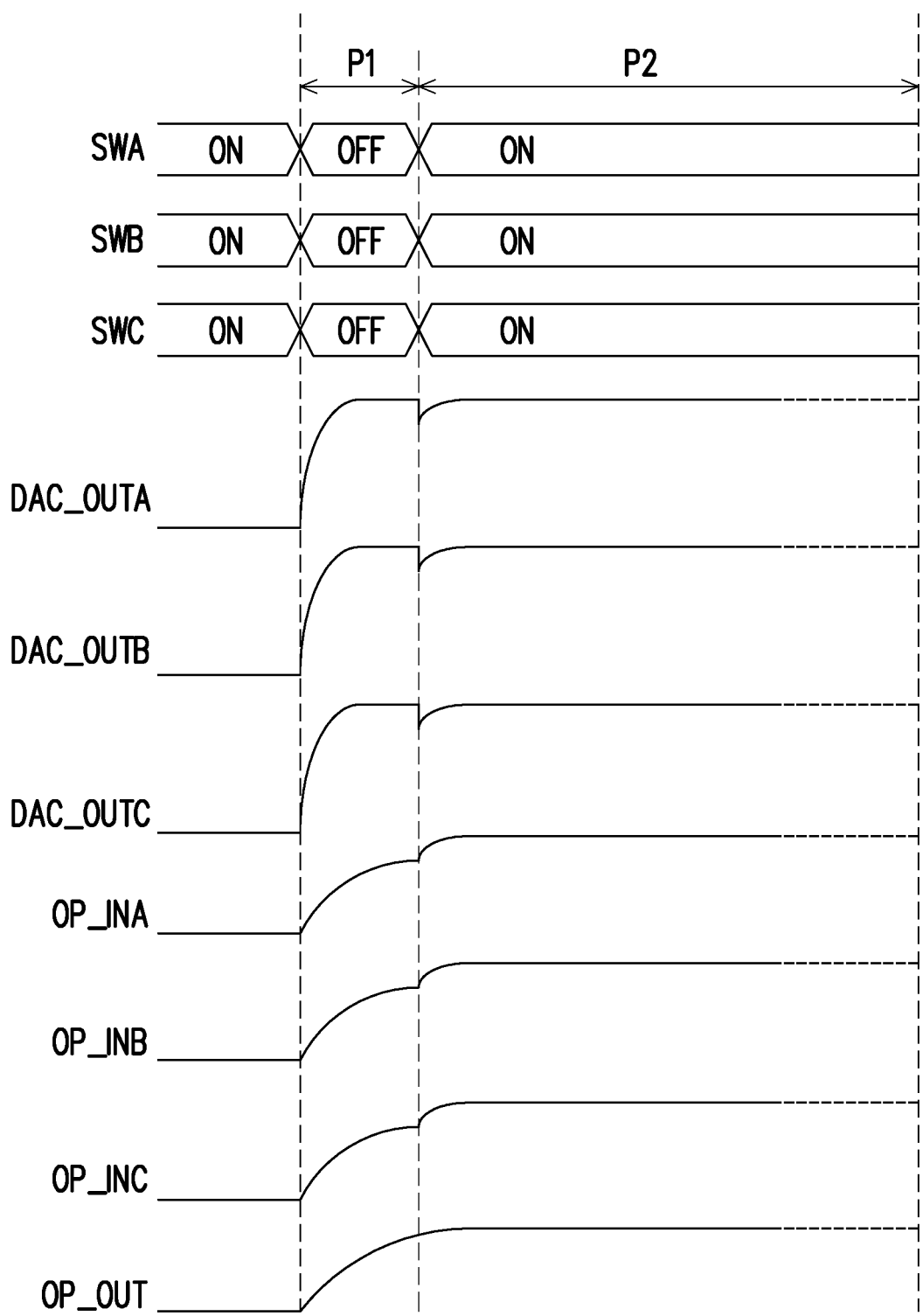
FIG. 7 is a schematic signal waveform diagram of the channel circuit according to an embodiment of the invention.

FIG. 7 is a schematic signal waveform diagram of the channel circuit according to an embodiment of the invention. FIG. 7 is explained together with FIG. 6 below. However, the waveform diagram of FIG. 6 is not limited to being applied to the channel circuit of FIG. 6 but can be applied to other channel circuits. Also, the channel circuit of FIG. 6 is not limited to operate with the signal waveforms shown in FIG. 7 but can operate with signals having different waveforms.

Referring to FIG. 6 and FIG. 7, during the pre-charge period P1, the switch SWA, the switch SWB and the switch SWC are OFF, and the pre-charge circuit 640 may pre-charge the first input terminal, the second input terminal and the third input terminal of the output buffer circuit 630. Because the switch SWA, the switch SWB and the switch SWC are OFF, it causes transition of an analog signal DAC_OUTA of the first output terminal, an analog signal DAC_OUTB of the second output terminal and an analog signal DAC_OUTC of the third output terminal of the DAC 610 to be accelerated (due to the reduction of the parasitic capacitance) during the pre-charge period P1. When the switch SWA, the switch SWB and the switch SWC are OFF, the pre-charge circuit 640 may pre-charge an input voltage OP_INA of the first input terminal, an input voltage OP_INB of the second input terminal and an input voltage OP_INC of the third input terminal of the output buffer circuit 630 to different preset levels (or the same preset level).

During the normal operation period P2, the switch SWA, the switch SWB and the switch SWC are ON, and the pre-charge circuit 640 does not pre-charge the first input terminal, the second input terminal and the third input terminal of the output buffer circuit 630. For instance, during the normal operation period P2, the output terminals of the pre-charge circuit 640 are in a Hi-z state. When the switch SWA, the switch SWB and the switch SWC are ON, an output terminal of the DAC 610 may provide the analog signals to the input terminals of the output buffer circuit 630 through the switch SWA, the switch SWB and the switch SWC.

Figure 8:
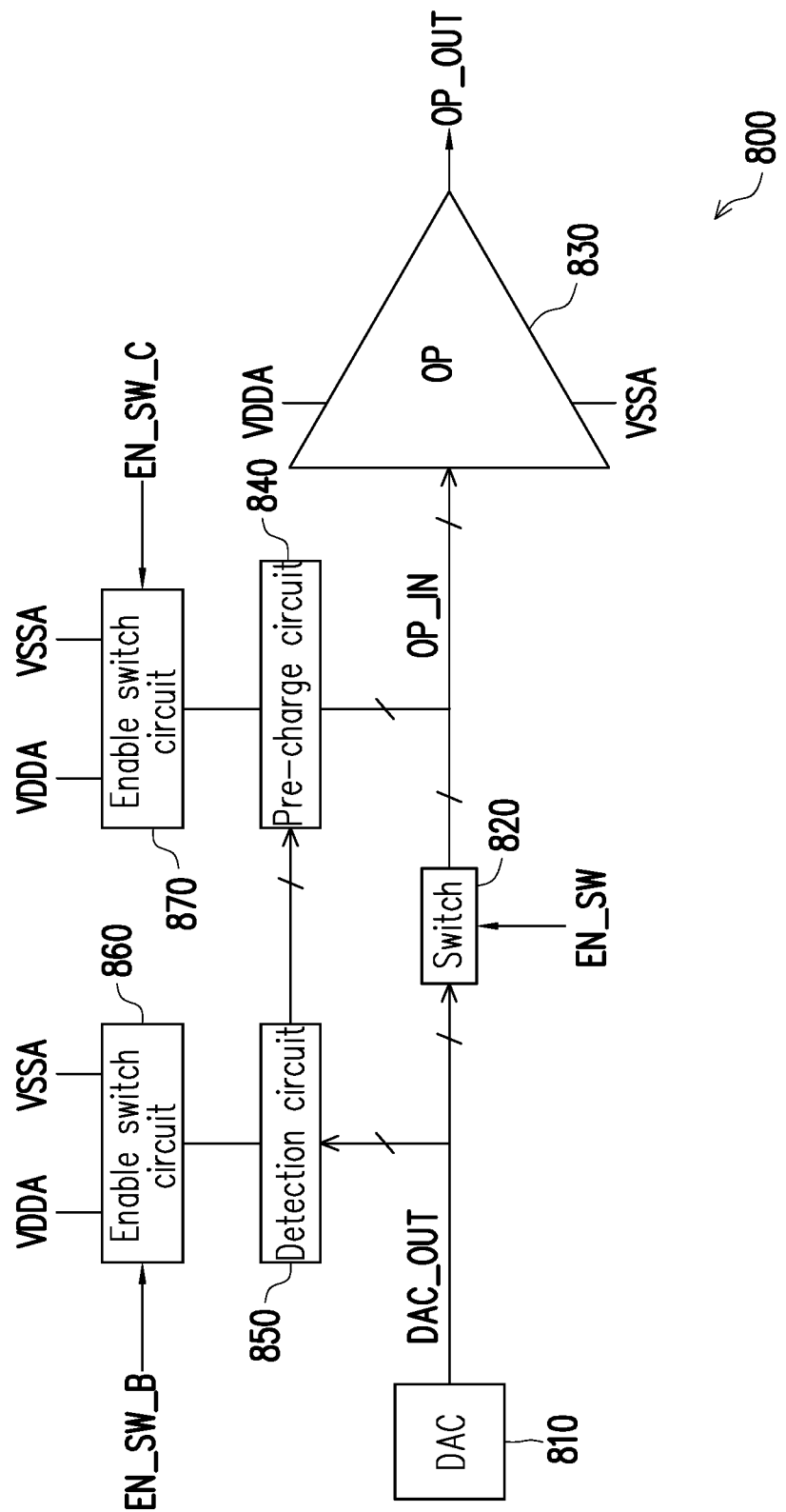
FIG. 8 is a schematic circuit block diagram illustrating a channel circuit of a source driver according to yet another embodiment of the invention.

FIG. 8 is a schematic circuit block diagram illustrating a channel circuit 800 of a source driver according to yet another embodiment of the invention. In the embodiment illustrated in FIG. 8, the channel circuit 800 includes a DAC 810, a switch 820, an output buffer circuit 830, a pre-charge circuit 840, a detection circuit 850, an enable switch circuit 860 and an enable switch circuit 870. The channel circuit 800, the DAC 810, the output buffer circuit 830, the pre-charge circuit 840 and the detection circuit 850 illustrated in FIG. 8 may be inferred with reference the descriptions related to the channel circuit 500, the DAC 210, the output buffer circuit 230, the pre-charge circuit 240 and the detection circuit 550 illustrated in FIG. 5, or with reference to the descriptions related to the channel circuit 600, the DAC 610, the output buffer circuit 630, the pre-charge circuit 640 and the detection circuit 650 illustrated in FIG. 6 and thus, will not be repeated. The switch 820 illustrated in FIG. 8 may be inferred with reference to the description related to the switch 220 illustrated in FIG. 5, or with reference to the descriptions related to the switch SWA, the switch SWB and the switch SWC illustrated in FIG. 6 and thus, will not be repeated.

During a pre-charge period, the switch is preferably OFF, and the pre-charge circuit 840 may pre-charge an input terminal of the output buffer circuit 830. During a normal operation period later than the pre-charge period, the switch 820 is ON, and the pre-charge circuit 840 does not pre-charge the input terminal of the output buffer circuit 830.

In the embodiment illustrated in FIG. 8, the enable switch circuit 860 is coupled to the detection circuit 850. The enable switch circuit 860 is controlled by an enable signal EN_SW_B to determine whether to transmit the voltage VDDA and the voltage VSSA to the detection circuit 850, i.e., determine whether to enable the detection circuit 850. The enable switch circuit 870 is coupled to the pre-charge circuit 840. The enable switch circuit 870 is controlled by an enable signal EN_SW_C to determine whether to transmit the voltage VDDA and the voltage VSSA to the pre-charge circuit 840, i.e., determine whether to enable the pre-charge circuit 840. When the switch 820 is ON, the detection circuit 850 and the pre-charge circuit 840 are disabled respectively by the enable signal EN_SW_B and the enable signal EN_SW_C. When the switch 820 is OFF, the detection circuit 850 and the pre-charge circuit 840 are respectively enabled by the enable signal EN_SW_B and the enable signal EN_SW_C.

Figure 9:
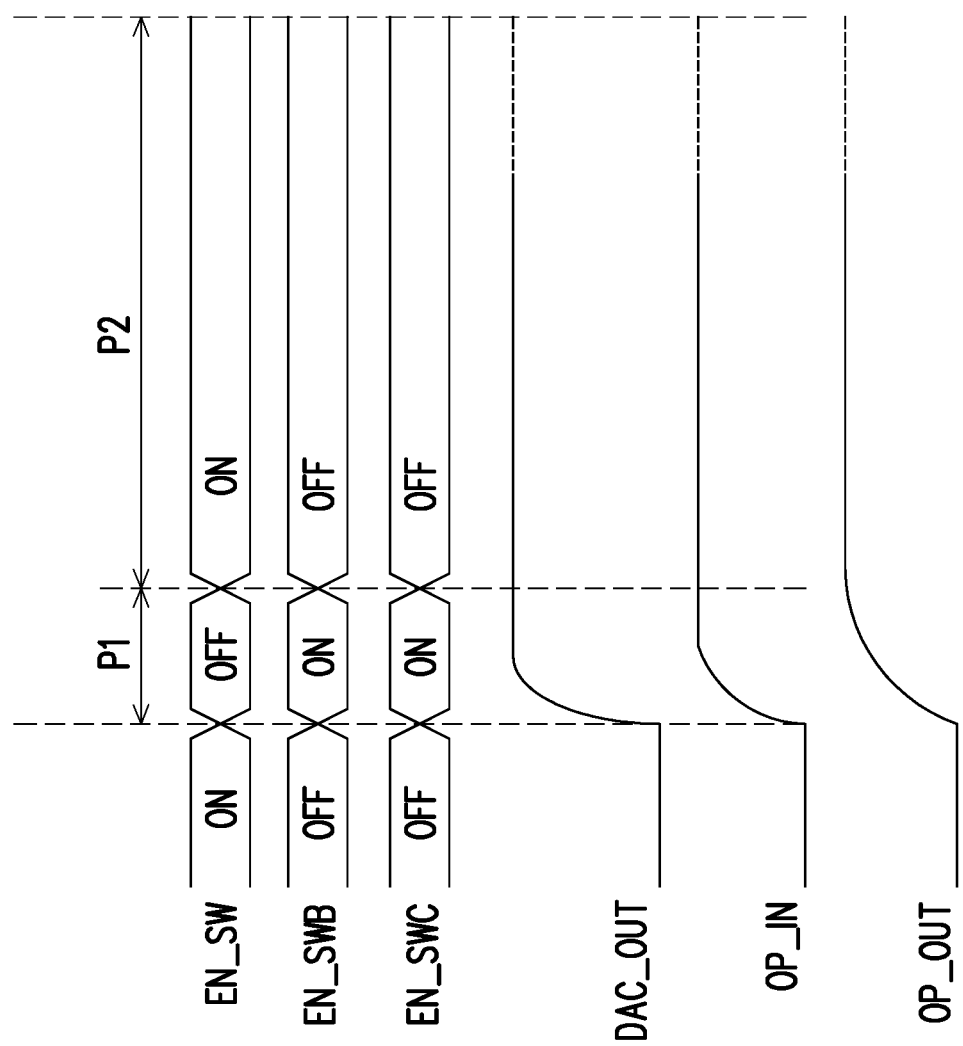
FIG. 9 is a schematic signal waveform diagram of the channel circuit according to an embodiment of the invention.

FIG. 9 is a schematic signal waveform diagram of the channel circuit according to an embodiment of the invention. FIG. 9 is explained together with FIG. 8 below. However, the waveform diagram of FIG. 9 is not limited to being applied to the channel circuit of FIG. 8 but can be applied to other channel circuits. Also, the channel circuit of FIG. 8 is not limited to operate with the signal waveforms shown in FIG. 9 but can operate with signals having different waveforms.

Referring to FIG. 8 and FIG. 9, during the pre-charge period P1, the switch 820 is OFF, and the pre-charge circuit 840 may pre-charge an input terminal of the output buffer circuit 830. During the normal operation period P2, the switch 820 is ON, and the pre-charge circuit 840 does not pre-charge the input terminal of the output buffer circuit 830.

In the embodiment illustrated in FIG. 8, the enable switch circuit 860 is coupled to the detection circuit 850. The enable switch circuit 860 is controlled by an enable signal EN_SW_B to determine whether to transmit the voltage VDDA and the voltage VSSA to the detection circuit 850, i.e., determine whether to enable the detection circuit 850. The enable switch circuit 870 is coupled to the pre-charge circuit 840. The enable switch circuit 870 is controlled by an enable signal EN_SW_C to determine whether to transmit the voltage VDDA and the voltage VSSA to the pre-charge circuit 840, i.e., determine whether to enable the pre-charge circuit 840. When the switch 820 is ON, the detection circuit 850 and the pre-charge circuit 840 are disabled respectively by the enable signal EN_SW_B and the enable signal EN_SW_C. When the switch 820 is OFF, the detection circuit 850 and the pre-charge circuit 840 are respectively enabled by the enable signal EN_SW_B and the enable signal EN_SW_C.

Figure 10:
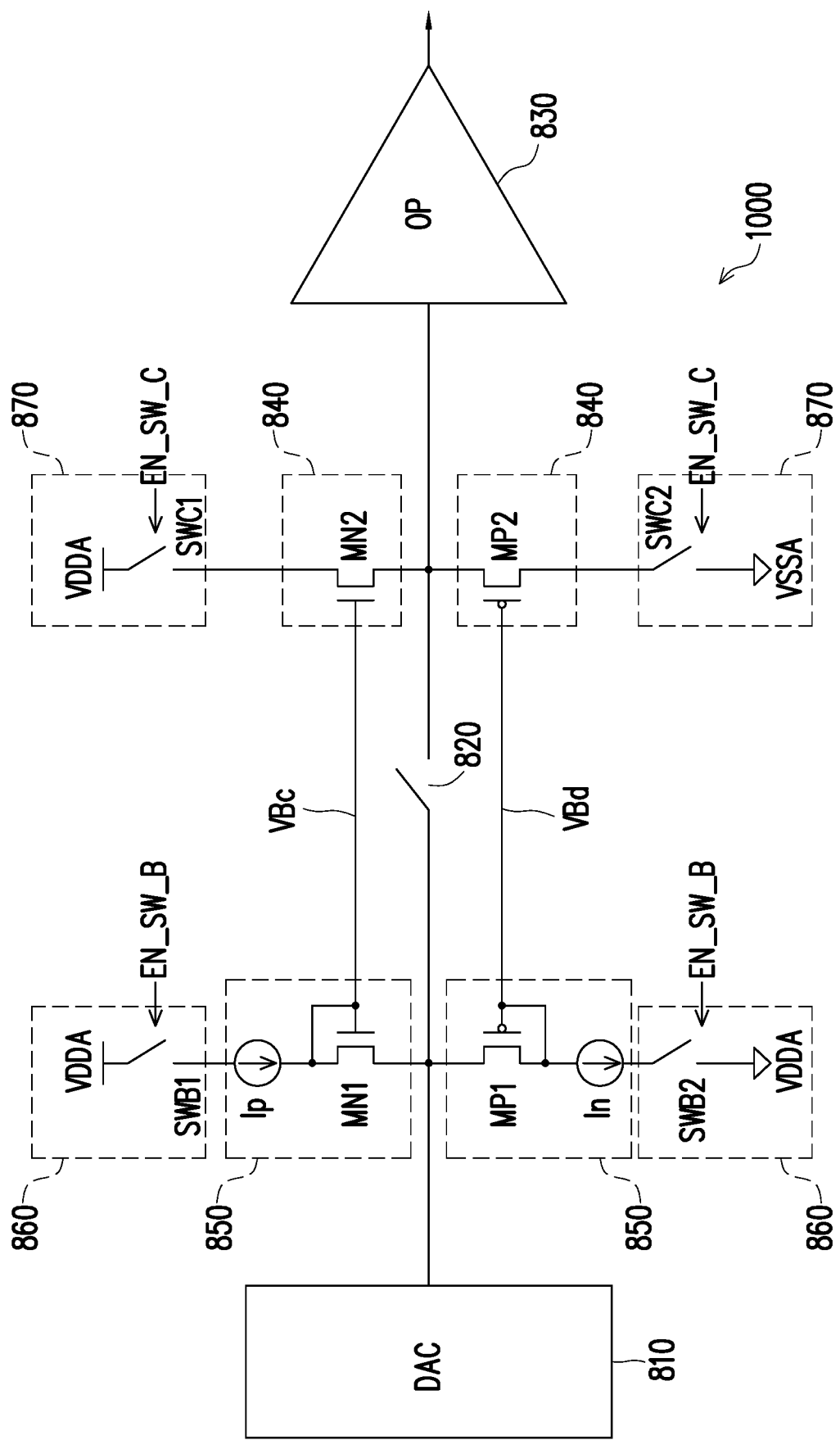
FIG. 10 is a schematic circuit block diagram illustrating a channel circuit of a source driver according to still another embodiment of the invention.

FIG. 10 is a schematic circuit block diagram illustrating a channel circuit 1000 of a source driver according to still another embodiment of the invention. In the embodiment illustrated in FIG. 10, the channel circuit 1000 includes a DAC 810, a switch 820, an output buffer circuit 830, a pre-charge circuit 840, a detection circuit 850, an enable switch circuit 860 and an enable switch circuit 870. The DAC 810, the switch 820, the output buffer circuit 830, the pre-charge circuit 840, the detection circuit 850, the enable switch circuit 860 and the enable switch circuit 870 illustrated in FIG. 10 may be inferred with reference to the descriptions related to the embodiment illustrated in FIG. 8 and thus, will not be repeated.

In the embodiment illustrated in FIG. 10, a detection result output by the detection circuit 850 includes a bias voltage VBc and a bias voltage VBd, the enable switch circuit 860 includes an enable switch SWB1 and an enable switch SWB2, and the detection circuit 850 includes a current source Ip, a transistor MN1, a current source In and a transistor MP1. A control terminal of the enable switch SWB1 may receive the enable signal EN_SW_B. A first terminal of the enable switch SWB1 is coupled to the voltage VDDA. A current drain terminal of the current source Ip is coupled to a second terminal of the enable switch SWB1. The first terminal (e.g., a drain) of the transistor MN1 is coupled to the current supply terminal of the current source Ip. A control terminal (e.g., a gate) of the transistor MN1 is coupled to the first terminal of the transistor MN1. A second terminal (e.g., a source) of the transistor MN1 is coupled to an output terminal of the DAC 810. A voltage of the control terminal of the transistor MN1 serves as the bias voltage VBc.

A control terminal of the enable switch SWB2 may receive the enable signal EN_SW_B. A first terminal of the enable switch SWB2 is coupled to the voltage VSSA. A current supply terminal of the current source In is coupled to a second terminal of the enable switch SWB2. A first terminal (e.g., a drain) of the transistor MP1 is coupled to the current drain terminal of the current source In. A control terminal (e.g., a gate) of the transistor MP1 is coupled to the first terminal of the transistor MP1. A second terminal (e.g., a source) of the transistor MP1 is coupled to the output terminal of the DAC 810. A voltage of the control terminal of the transistor MP1 serves as the bias voltage VBd.

In the embodiment illustrated in FIG. 10, the enable switch circuit 870 includes an enable switch SWC1 and an enable switch SWC2, and the pre-charge circuit 840 includes a transistor MN2 and a transistor MP2. A control terminal of the enable switch SWC1 is configured to receive the enable signal EN_SW_C. A first terminal of the enable switch SWC1 is coupled to the voltage VDDA. A control terminal (e.g., a gate) of the transistor MN2 is coupled to the detection circuit 850 to receive the bias voltage VBc. A first terminal (e.g., a drain) of the transistor MN2 is coupled to a second terminal of the enable switch SWC1, a second terminal (e.g., a source) of the transistor MN2 is coupled to the input terminal of the output buffer circuit 830. A control terminal of the enable switch SWC2 is configured to receive the enable signal EN_SW_C. A first terminal of the enable switch SWC2 is coupled to the voltage VSSA. A control terminal (e.g., a gate) of the transistor MP2 is coupled to the detection circuit 850 to receive the bias voltage VBd. A first terminal (e.g., a drain) of the transistor MP2 is coupled to a second terminal of the enable switch SWC2. A second terminal (e.g., a source) of the transistor MP2 is coupled to the input terminal of the output buffer circuit 830.

Figure 11:
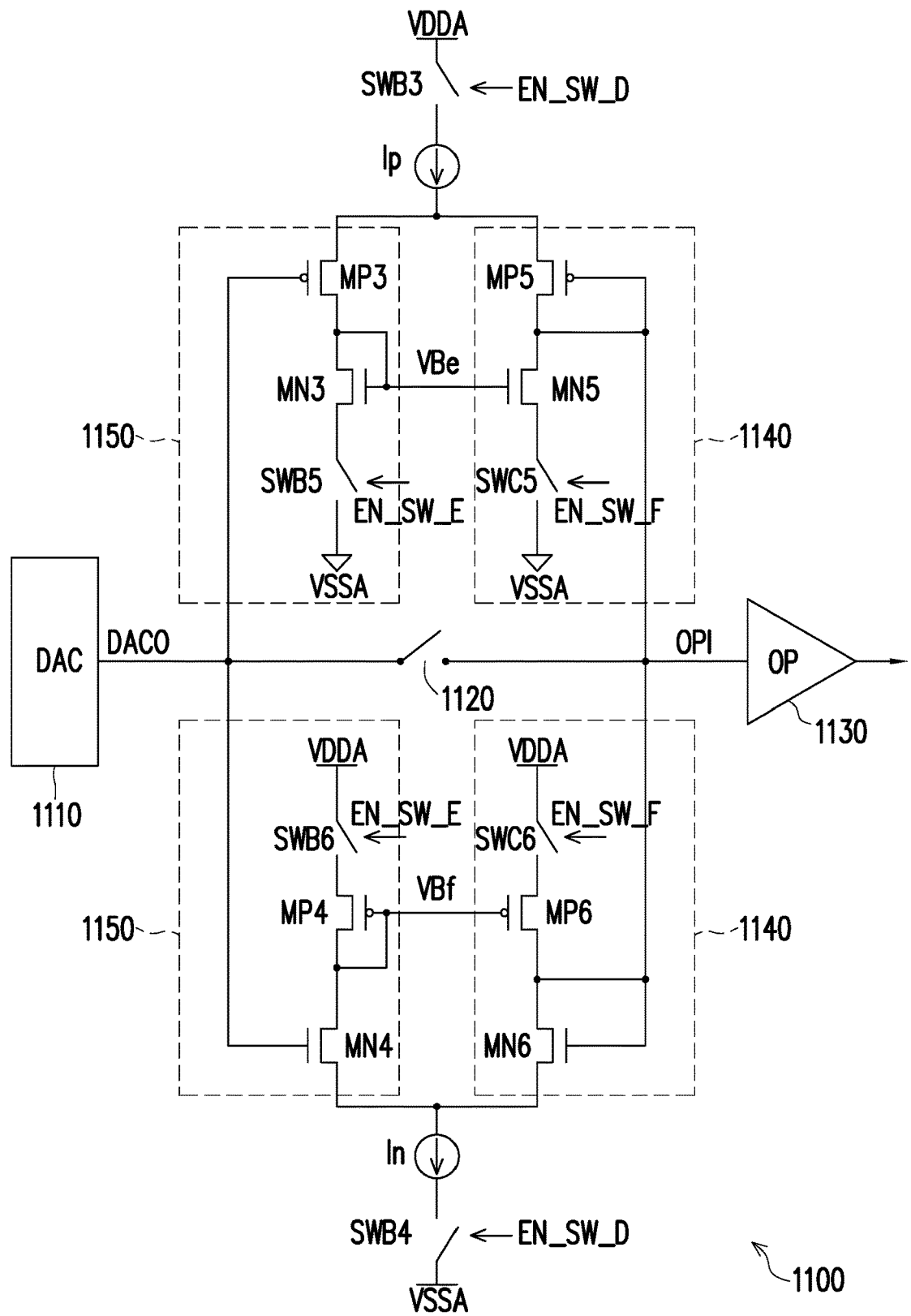
FIG. 11 is a schematic circuit block diagram illustrating a channel circuit of a source driver according to another embodiment of the invention.

FIG. 11 is a schematic circuit block diagram illustrating a channel circuit 1100 of a source driver according to another embodiment of the invention. In the embodiment illustrated in FIG. 11, the channel circuit 1100 includes a DAC 1110, a switch 1120, an output buffer circuit 1130, at least one pre-charge circuit 1140, at least one detection circuit 1150, an enable switch SWB3, a current source Ip, a current source In and an enable switch SWB4. The channel circuit 1100, the DAC 1110, the switch 1120, the output buffer circuit 1130, the pre-charge circuit 1140 and the detection circuit 1150 illustrated in FIG. 11 may be inferred with reference to the descriptions related to the channel circuit 500, the DAC 210, the switch 220, the output buffer circuit 230, the pre-charge circuit 240 and the detection circuit 250 illustrated in FIG. 5 and thus, will not be repeated.

In the embodiment illustrated in FIG. 11, a control terminal of the enable switch SWB3 is configured to receive an enable signal EN_SW_D. A first terminal of the enable switch SWB3 is coupled to the voltage VDDA. The current drain terminal of the current source Ip is coupled to a second terminal of the enable switch SWB3. The current supply terminal of the current source Ip is coupled to the detection circuit 1150 and the pre-charge circuit 1140. A control terminal of the enable switch SWB4 receives the enable signal EN_SW_D. A first terminal of the enable switch SWB4 is coupled to the voltage VSSA. The current supply terminal of the current source In is coupled to a second terminal of the enable switch SWB4. The current drain terminal of the current source In is coupled to the detection circuit 1150 and the pre-charge circuit 1140.

In the embodiment illustrated in FIG. 11, a detection result output by the detection circuit 1150 includes a bias voltage VBe and a bias voltage VBf, and the detection circuit 1150 includes a transistor MP3, a transistor MN3, an enable switch SWB5, a transistor MP4, a transistor MN4 and an enable switch SWB6. A first terminal (e.g., a source) of the transistor MP3 is coupled to the current supply terminal of the current source Ip. A control terminal (e.g., a gate) of the transistor MP3 is coupled to an output terminal of the DAC 1110 to receive an analog signal DACO. A first terminal (e.g., a drain) of the transistor MN3 is coupled to a second terminal (e.g., a drain) of the transistor MP3. A control terminal (e.g., a gate) of the transistor MN3 is coupled to the first terminal of the transistor MN3. A voltage of the control terminal of the transistor MN3 serves as the bias voltage VBe. A control terminal of the enable switch SWB5 is configured to receive an enable signal EN_SW_E. A first terminal of the enable switch SWB5 is coupled to a second terminal (e.g., a source) of the transistor MN3. A second terminal of the transistor MN3 is coupled to the voltage VSSA.

A first terminal (e.g., a source) of the transistor MN4 is coupled to the current drain terminal of the current source In. A control terminal (e.g., a gate) of the transistor MN4 is coupled to the output terminal of the DAC 1110 to receive the analog signal DACO. A first terminal (e.g., a drain) of the transistor MP4 is coupled to a second terminal (e.g., a drain) of the transistor MN4. The control terminal of the transistor MP4 is coupled to the first terminal of the transistor MP4. A voltage of the control terminal of the transistor MP4 serves as the bias voltage VBf. A control terminal of the enable switch SWB6 is configured to receive the enable signal EN_SW_E. A first terminal of the enable switch SWB6 is coupled to a second terminal (e.g., a source) of the transistor MP4. A second terminal of the enable switch SWB6 is coupled to the voltage VDDA.

In the embodiment illustrated in FIG. 11, the pre-charge circuit 1140 includes a transistor MP5, a transistor MN5, an enable switch SWC5, a transistor MN6, a transistor MP6 and an enable switch SWC6. A first terminal (e.g., a source) of the transistor MP5 is coupled to the current supply terminal of the current source Ip. A second terminal (e.g., a drain) of the transistor MP5 is coupled to an input terminal of the output buffer circuit 1130. A control terminal (e.g., a gate) of the transistor MP5 is coupled to the second terminal of the transistor MP5 and is coupled to the input terminal of the output buffer circuit 1130 to receive an input voltage OPI. A control terminal (e.g., a gate) of the transistor MN5 is coupled to the detection circuit 1150 to receive the bias voltage VBe. A first terminal (e.g., a drain) of the transistor MN5 is coupled to the second terminal of the transistor MP5. A control terminal of the enable switch SWC5 is configured to receive an enable signal EN_SW_F. A first terminal of the enable switch SWC5 is coupled to a second terminal (e.g., a source) of the transistor MN5. A second terminal of the enable switch SWC5 is coupled to the voltage VSSA.

A first terminal (e.g., a source) of the transistor MN6 is coupled to the current drain terminal of the current source In. A second terminal (e.g., a drain) of the transistor MN6 is coupled to the input terminal of the output buffer circuit 1130. A control terminal (e.g., a gate) of the transistor MN6 is coupled to the second terminal of the transistor MN6 and is coupled to the input terminal of the output buffer circuit 1130 to receive the input voltage OPI. A control terminal (e.g., a gate) of the transistor MP6 is coupled to the detection circuit 1150 to receive the bias voltage VBf. A first terminal (e.g., a drain) of the transistor MP6 is coupled to the second terminal of the transistor MN6. A control terminal of the enable switch SWC6 is configured to receive the enable signal EN_SW_F. A first terminal of the enable switch SWC6 is coupled to a second terminal (e.g., a source) of the transistor MP6. A second terminal of the enable switch SWC6 is coupled to the voltage VDDA.

Figure 12:
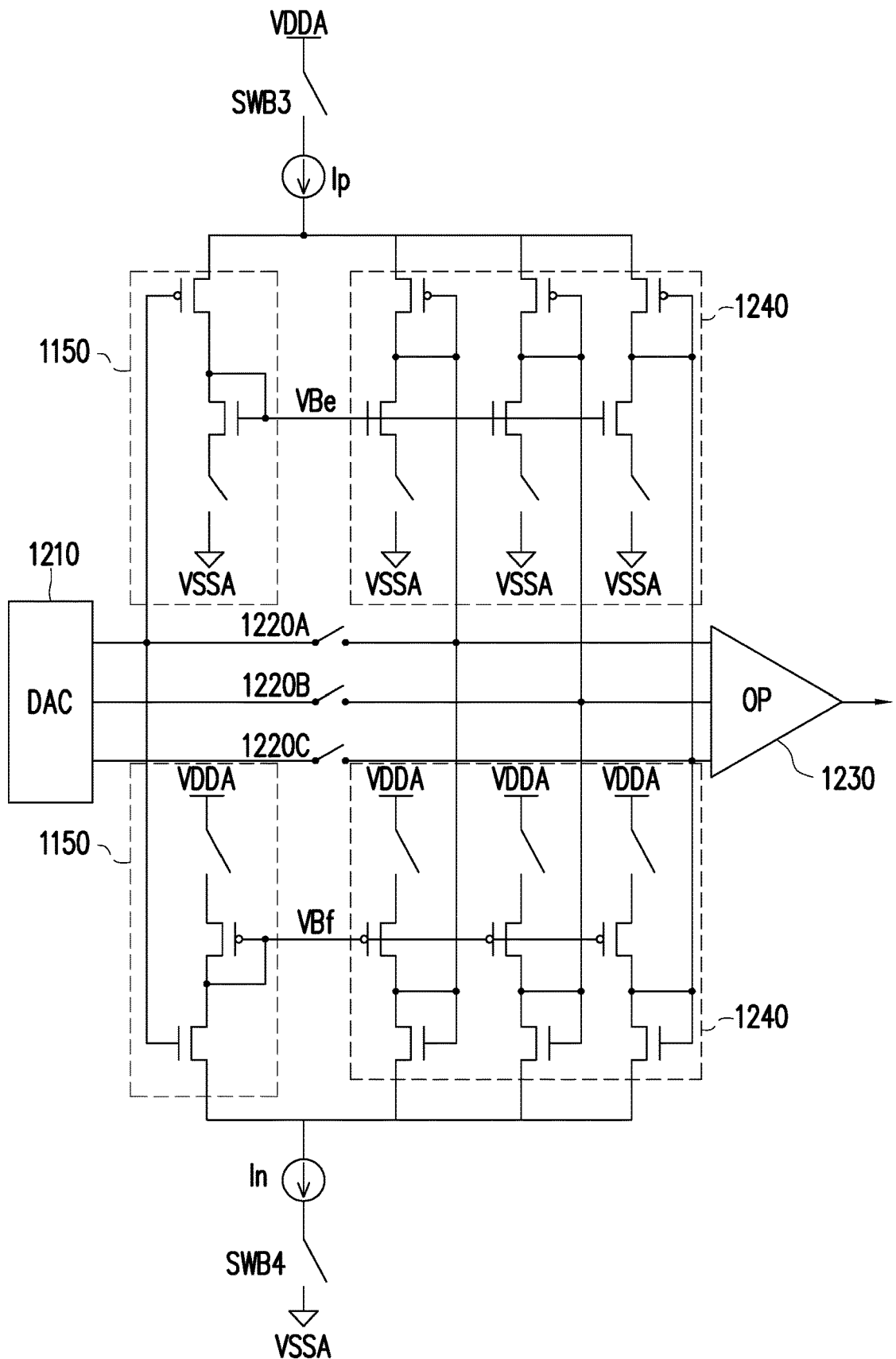
FIG. 12 is a schematic circuit block diagram illustrating a channel circuit of a source driver according to yet another embodiment of the invention.

FIG. 12 is a schematic circuit block diagram illustrating a channel circuit 1200 of a source driver according to yet another embodiment of the invention. In the embodiment illustrated in FIG. 12, the channel circuit 1200 includes a DAC 1210, a switch 1220A, a switch 1220B, a switch 1220C, an output buffer circuit 1230, at least one pre-charge circuit 1240, at least one detection circuit 1150, an enable switch SWB3, a current source Ip, a current source In and an enable switch SWB4. The DAC 1210, the switch 1220A, the switch 1220B, the switch 1220C and the output buffer circuit 1230 illustrated in FIG. 12 may be inferred with reference to the descriptions related to the DAC 610, the switch SWA, the switch SWB, the switch SWC and the output buffer circuit 630 illustrated in FIG. 6, and the pre-charge circuit 1240, the detection circuit 1150, the enable switch SWB3, the current source Ip, the current source In and the enable switch SWB4 illustrated in FIG. 12 may be inferred with reference to the descriptions related to the pre-charge circuit 1140, the detection circuit 1150, the enable switch SWB3, the current source Ip, the current source In and the enable switch SWB4 illustrated in FIG. 11, which will not be repeated.

In view of the foregoing, the channel circuit of the source driver and the operation method thereof provided by the embodiments of the invention can pre-charge the input terminal of the output buffer circuit via the pre-charge circuit with sufficient pushing power during the pre-charge period before the normal operation period. During the normal operation period following the pre-charge period, the output terminal of the digital-to-analog converter can provide the analog signal to the input terminal of the output buffer circuit through the switch. Thus, the recovery time of the output of the digital-to-analog converter can be effectively shortened. The shortened recovery time of the output of the digital-to-analog converter can contribute to increasing the operation frequency of the display panel.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A channel circuit of a source driver, comprising:
   a digital-to-analog converter;
   a first switch, having a first terminal coupled to a first output terminal of the digital-to-analog converter;
   an output buffer circuit, having a first input terminal coupled to a second terminal of the first switch, and an output terminal configured to drive a data line of a display panel;
   a pre-charge circuit, coupled to the first input terminal of the output buffer circuit, and configured to pre-charge the first input terminal of the output buffer circuit when the first switch is turned off during a pre-charge period and not pre-charge the first input terminal of the output buffer circuit when the first switch is turned on during a normal operation period; and
   a detection circuit, coupled to the pre-charge circuit for providing a detection result, wherein
   the detection circuit is coupled to the first output terminal of the digital-to-analog converter and the first input terminal of the output buffer circuit to detect a difference between a voltage of the first output terminal of the digital-to-analog converter and a voltage of the first input terminal of the output buffer circuit, and configured to enable the pre-charge circuit to pre-charge the first input terminal of the output buffer circuit according to the difference.

2. The channel circuit according to claim 1, wherein the pre-charged circuit is configured to pre-charge the first input terminal of the output buffer circuit according to the detection result during the pre-charge period.

3. The channel circuit according to claim 2, wherein the pre-charge circuit is configured to determine a pre-charge voltage level according to the detection result, so as to pre-charge the first input terminal of the output buffer circuit according to the pre-charge voltage level.

4. The channel circuit according to claim 2, wherein the channel circuit further comprises a second switch having a first terminal, and a second terminal coupled respectively to a second output terminal of the digital-to-analog converter and a second input terminal of the output buffer circuit.

5. The channel circuit according to claim 4, wherein the pre-charge circuit comprises:
   a first transistor, having a control terminal coupled to a detection circuit to receive a first bias voltage, a first terminal coupled to a first voltage, and a second terminal coupled to the second input terminal of the output buffer circuit; and
   a second transistor, having a control terminal coupled to the detection circuit to receive a second bias voltage, a first terminal coupled to a second voltage, and a second terminal coupled to the second input terminal of the output buffer circuit.

6. The channel circuit according to claim 2, further comprising:
   a first enable switch circuit, couple to the detection circuit, and configured to be controlled by a first enable signal; and
   a second enable switch circuit, couple to the pre-charge circuit, and configured to be controlled by a second enable signal.

7. The channel circuit according to claim 6, wherein the detection circuit and the pre-charge circuit are disabled respectively by the first enable signal and the second enable signal when the first switch is turned on, and the detection circuit and the pre-charge circuit are enabled respectively by the first enable signal and the second enable signal when the first switch is turned off.

8. The channel circuit according to claim 1, wherein the detection result comprises a first bias voltage and a second bias voltage.

9. The channel circuit according to claim 8, wherein the detection circuit comprises:
   a first transistor, having a control terminal coupled to the first output terminal of the digital-to-analog converter, a first terminal coupled to a current supply terminal of a first current source, and a second terminal of the first transistor coupled to the first input terminal of the output buffer circuit, wherein a voltage of the first terminal of the first transistor serves as the first bias voltage; and
   a second transistor, having a control terminal coupled to the first output terminal of the digital-to-analog converter, a first terminal of the second transistor coupled to a current drain terminal of a second current source, and a second terminal of the second transistor coupled to the first input terminal of the output buffer circuit, wherein a voltage of the first terminal of the second transistor serves as the second bias voltage.

10. The channel circuit according to claim 9, wherein the pre-charge circuit comprises:
    a third transistor, having a control terminal coupled to the detection circuit to receive the first bias voltage, a first terminal coupled to a first voltage, and a second terminal coupled to the first input terminal of the output buffer circuit; and
    a fourth transistor, having a control terminal coupled to the detection circuit to receive the second bias voltage, a first terminal coupled to a second voltage, and a second terminal coupled to the first input terminal of the output buffer circuit.

11. The channel circuit according to claim 1, when the difference exceeds a predetermined difference, the detection circuit is configured to enable the pre-charge circuit to pre-charge the input terminal of the output buffer circuit.

12. An operation method of a channel circuit of a source driver, comprising:
    providing an analog signal to a first input terminal of an output buffer circuit by a first output terminal of a digital-to-analog converter through a first switch during a normal operation period, wherein an output terminal of the output buffer circuit is configured to drive a data line of a display panel;
    detecting a difference between a voltage of the first output terminal of the digital-to-analog converter and a voltage of the first input terminal of the output buffer circuit by a detection circuit;
    enabling, by the detection circuit, the pre-charge circuit to pre-charge the first input terminal of the output buffer circuit according to the difference when the first switch is turned off during a pre-charge period; and
    not pre-charging the first input terminal of the output buffer circuit by the pre-charge circuit when the first switch is turned on during a normal operation period.

13. The operation method according to claim 12, further comprising:
    providing a detection result to the pre-charge circuit by a detection circuit, wherein the pre-charged circuit is configured to pre-charge the first input terminal of the output buffer circuit according to the detection result during the pre-charge period.

14. The operation method according to claim 13, wherein the step of pre-charging comprises:
  determining a pre-charge voltage level according to the detection result by the pre-charge circuit, so as to pre-charge the first input terminal of the output buffer circuit according to the pre-charge voltage level.

15. The operation method according to claim 13, further comprising:
  detecting the first output terminal of the digital-to-analog converter during the pre-charge period by the detection circuit to obtain the detection result.

16. The operation method according to claim 15, further comprising:
  detecting an input of the output buffer circuit detection circuit by the output buffer circuit; and
  obtaining the detection result according to a difference between a voltage of the first output terminal of the digital-to-analog converter and a voltage of the first input terminal of the output buffer circuit by the detection circuit.

17. The operation method according to claim 13, wherein the detection circuit is controlled by a first enable signal, the pre-charge circuit is controlled by a second enable signal, and the operation method further comprises:
  disabling the detection circuit and the pre-charge circuit respectively by the first enable signal and the second enable signal when the first switch is turned on; and
  enabling the detection circuit and the pre-charge circuit respectively by the first enable signal and the second enable signal when the first switch is turned off.

18. A channel circuit of a source driver, comprising:
  a digital-to-analog converter;
  a first switch, having a first terminal coupled to a first output terminal of the digital-to-analog converter;
  an output buffer circuit, having a first input terminal coupled to a second terminal of the first switch, and an output terminal configured to drive a data line of a display panel;
  a pre-charge circuit, coupled to the first input terminal of the output buffer circuit, and configured to pre-charge the first input terminal of the output buffer circuit; and
  a detection circuit, coupled to the pre-charge circuit, and configured to provide a detection result to the pre-charge circuit, wherein the detection circuit is configured to detect a difference between a voltage of the first output terminal of the digital-to-analog converter and a voltage of the first input terminal of the output buffer circuit and enable the pre-charged circuit to pre-charge the first input terminal of the output buffer circuit according to the difference.

19. The channel circuit according to claim 18, wherein the pre-charge circuit is configured to determine a pre-charge voltage level according to the detection result, so as to pre-charge the first input terminal of the output buffer circuit according to the pre-charge voltage level.

20. The channel circuit according to claim 18, wherein the detection circuit is coupled to the first output terminal of the digital-to-analog converter, and configured to detect the first output terminal of the digital-to-analog converter to obtain the detection result.

21. The channel circuit according to claim 18, wherein the channel circuit further comprises a second switch having a first terminal and a second terminal coupled respectively to a second output terminal of the digital-to-analog converter and a second input terminal of the output buffer circuit.

22. The channel circuit according to claim 18, further comprising:
  a first enable switch circuit, coupled to the detection circuit, and configured to be controlled by a first enable signal; and
  a second enable switch circuit, coupled to the pre-charge circuit, and configured to be controlled by a second enable signal.

23. The channel circuit according to claim 18, wherein the pre-charge circuit is configured to pre-charge the first input terminal of the output buffer circuit when the first switch is turned off.

24. The channel circuit according to claim 18, wherein the pre-charge circuit is configured not to pre-charge the first input terminal of the output buffer circuit when the first switch is turned on.

* * * * *